United States Patent
Kanda et al.

(10) Patent No.: US 12,328,822 B2
(45) Date of Patent: Jun. 10, 2025

(54) SUBSTRATE SUPPORT PIN INSTALLATION JIG

(71) Applicant: FUJI CORPORATION, Chiryu (JP)

(72) Inventors: Tomohisa Kanda, Anjo (JP); Takehiro Noguchi, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 503 days.

(21) Appl. No.: 17/764,840

(22) PCT Filed: Oct. 2, 2019

(86) PCT No.: PCT/JP2019/039007
§ 371 (c)(1),
(2) Date: Mar. 29, 2022

(87) PCT Pub. No.: WO2021/064922
PCT Pub. Date: Apr. 8, 2021

(65) Prior Publication Data
US 2022/0322588 A1 Oct. 6, 2022

(51) Int. Cl.
*H05K 13/04* (2006.01)
*H05K 13/00* (2006.01)

(52) U.S. Cl.
CPC ......... *H05K 13/04* (2013.01); *H05K 13/0069* (2013.01)

(58) Field of Classification Search
CPC .................... H05K 13/04; H05K 13/0069
See application file for complete search history.

(56) References Cited

U.S. PATENT DOCUMENTS

| 5,218,753 A * | 6/1993 | Suzuki | H05K 13/0069 |
| | | | 29/760 |
| 6,212,751 B1 | 4/2001 | Hattori | |
| 6,219,897 B1 * | 4/2001 | Inutsuka | H05K 13/0069 |
| | | | 269/903 |

(Continued)

FOREIGN PATENT DOCUMENTS

| JP | 2008-153457 A | 7/2008 |
| JP | 2008-166583 A | 7/2008 |

OTHER PUBLICATIONS

International Search Report mailed on Dec. 17, 2019 in PCT/JP2019/039007 filed on Oct. 2, 2019 (2 pages).

*Primary Examiner* — Aneeta Yodichkas
*Assistant Examiner* — Jose K Abraham
(74) *Attorney, Agent, or Firm* — Oblon, McClelland, Maier & Neustadt, L.L.P.

(57) ABSTRACT

There is provided a novel substrate support pin installation jig used when installing a substrate support pin for supporting a circuit substrate. The substrate support pin installation jig (hereinafter, may be simply referred to as a jig) according to the present disclosure includes a main body configured to move relative to a support base, multiple pin accommodating portions provided in the main body, and a positioned portion used for positioning on the support base. The substrate support pin is accommodated and held in at least one of multiple pin accommodating portions in the jig. The jig is placed on the support base in a state where a relative position is specified by the positioned portion. By releasing holding of the substrate support pin, the substrate support pin is installed on the support base, and then the jig is removed.

3 Claims, 11 Drawing Sheets

(56) References Cited

U.S. PATENT DOCUMENTS

| | | | | |
|---|---|---|---|---|
| 6,347,442 | B1* | 2/2002 | Hwang | H05K 13/0069 269/21 |
| 6,635,308 | B1* | 10/2003 | Forrest | H05K 3/3415 228/180.1 |
| 6,726,195 | B1* | 4/2004 | Hertz | B23Q 1/035 269/309 |
| 7,259,833 | B2* | 8/2007 | Nimmakayala | H01L 21/6875 355/75 |
| 7,311,302 | B1* | 12/2007 | Farlow | H05K 13/0069 269/21 |
| 7,447,045 | B2* | 11/2008 | Ikeya | H05K 13/0069 361/810 |
| 8,661,657 | B2* | 3/2014 | Ito | H05K 13/0069 29/760 |
| 2001/0007594 | A1* | 7/2001 | Kadomatsu | H05K 13/0069 382/293 |
| 2002/0014000 | A1* | 2/2002 | Iwaki | H05K 13/0069 29/739 |
| 2004/0027811 | A1* | 2/2004 | Onitsuka | H05K 3/0058 361/749 |
| 2006/0265865 | A1* | 11/2006 | Yoshida | H05K 13/0061 29/729 |
| 2009/0126187 | A1* | 5/2009 | Kajiyama | H05K 13/0069 29/760 |
| 2013/0118006 | A1* | 5/2013 | Kinoshita | H05K 13/046 29/739 |
| 2013/0160288 | A1* | 6/2013 | Noda | H05K 13/0061 29/832 |
| 2014/0201998 | A1* | 7/2014 | Yamashita | H05K 13/0015 29/854 |
| 2014/0215813 | A1* | 8/2014 | Kishimoto | H05K 13/08 29/745 |
| 2017/0354068 | A1* | 12/2017 | Yamamoto | H05K 13/0069 |
| 2018/0359887 | A1* | 12/2018 | Barrett | B23K 3/087 |
| 2019/0150333 | A1* | 5/2019 | Takehara | H05K 13/0069 29/739 |

* cited by examiner

SUBSTRATE SUPPORT PIN INSTALLATION JIG

TECHNICAL FIELD

The present disclosure relates to a substrate support pin installation jig used when a substrate support pin for supporting a circuit substrate is installed on a support base, and a method for installing the substrate support pin which is a method for installing the substrate support pin on the support base.

BACKGROUND ART

Patent Literature 1 discloses a support pin base that holds multiple substrate support pins (hereinafter, referred to as "support pin"), and includes (a) a main body fixedly installed on a support base that can be lifted and lowered with respect to a circuit substrate, (b) multiple pin accommodation holes formed so as to penetrate the main body in the up-down direction, and (c) a shutter plate inserted so as to be relatively movable in an intermediate portion of the main body in the up-down direction and slidable between a holding position where the support pin is held from below and a non-holding position where the support pin is not held. A jig base is carried into above the support pin base in a state where the multiple support pins are accommodated in the multiple pin accommodation holes. A magnet is fitted into a portion of the jig base corresponding to a reference position where the support pin is to be installed. The support pin base is raised to bring into contact with the magnet and the support pin, and then the support pin base is lowered. As a result, the support pin in contact with the magnet protrudes upward with respect to the other support pins, so that the shutter plate is moved to the holding position. As a result, the support pin is installed at the reference position of the support base via the support pin base.

PATENT LITERATURE

Patent Literature 1: JP-A-2008-153457

BRIEF SUMMARY

Technical Problem

It is an object of the present disclosure to provide a novel substrate support pin installation jig and a method for installing the substrate support pin.

Solution to Problem and Advantageous Effects

A substrate support pin installation jig (hereinafter, may be referred to as "jig") according to the present disclosure includes a main body configured to move relative to a support base, multiple pin accommodating portions provided in the main body, and a positioned portion used for positioning on the support base. The substrate support pin is accommodated and held in at least one of the multiple pin accommodating portions of the jig. The jig is placed on the support base in a state where the jig is positioned by the positioned portion. By releasing holding of at least one substrate support pin, the at least one substrate support pin is installed on the support base, and then the jig is removed. As a result, each of the at least one substrate support pin is installed at a predetermined position on the support base. The jig and a method for installing the substrate support pin according to the present disclosure are not described in Patent Literature 1, and are novel.

DESCRIPTION OF EMBODIMENTS

Hereinafter, an embodiment of the present disclosure will be described in detail based on the accompanying drawings.

Example

Figure 1:
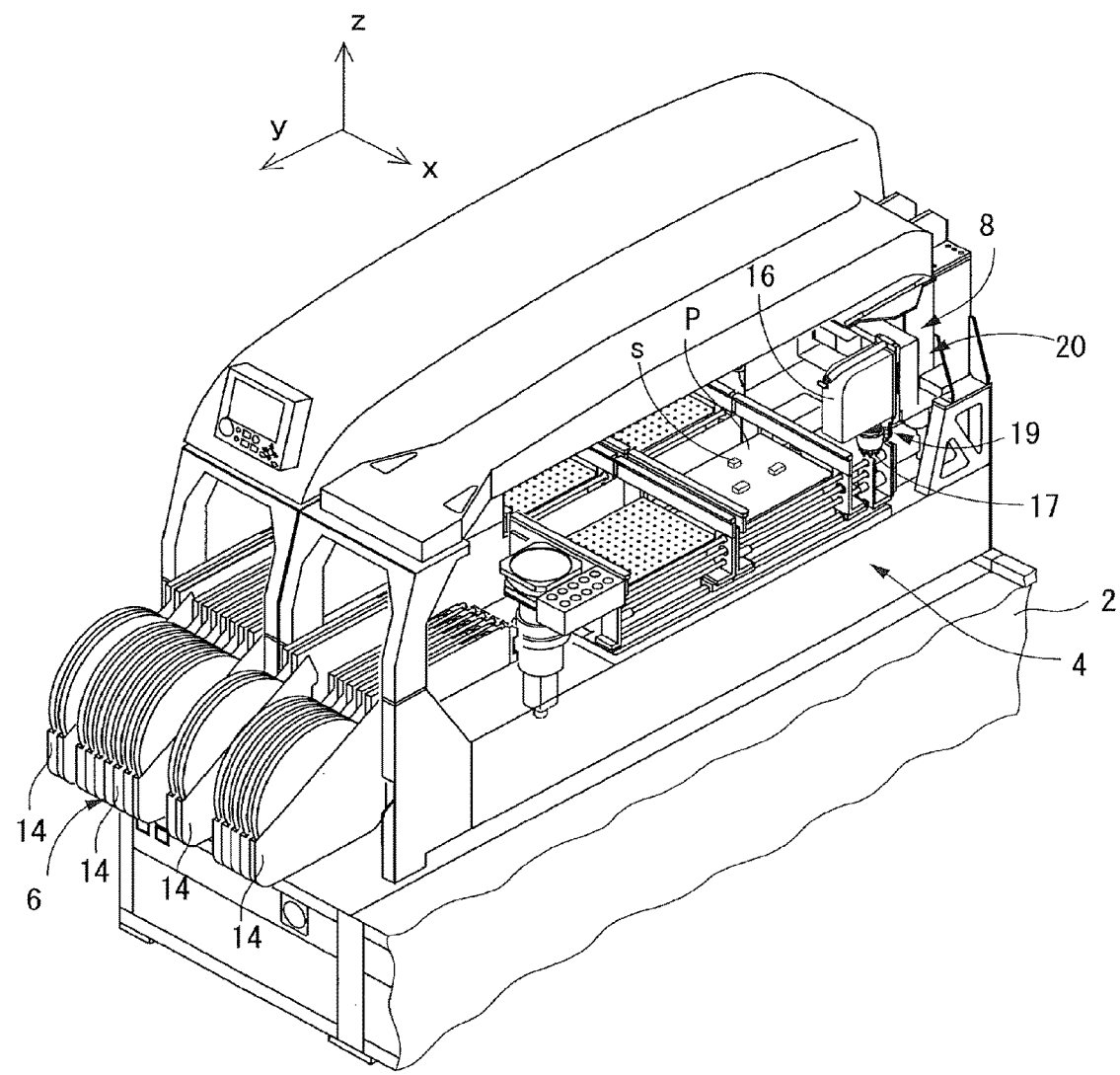
FIG. 1 is a perspective view of a mounter in which an electronic component is mounted on a circuit substrate.

A mounter illustrated in FIG. 1 mounts electronic component (hereinafter, may be referred to as "component") s to circuit substrate (hereinafter, may be referred to as a substrate) P, and includes device main body 2, circuit substrate conveyance and holding device 4, component supply device 6, head moving device 8, and the like.

Figure 2:
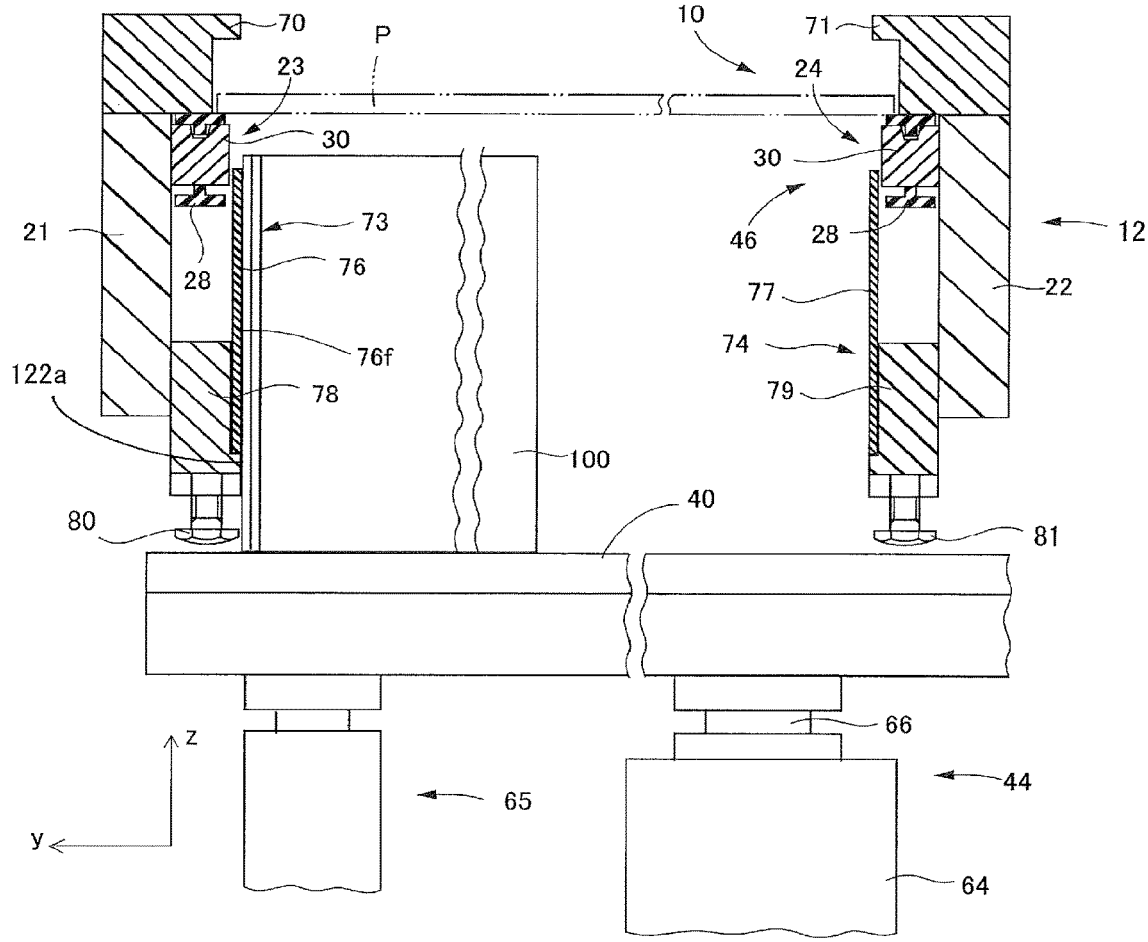
FIG. 2 is a side view illustrating a substrate holding device of the mounter.

Circuit substrate conveyance and holding device 4 conveys and holds substrate P, and includes substrate conveyance device 10 and substrate holding device 12 illustrated in FIG. 2. In FIG. 1, the conveyance direction of substrate P is the x direction, the width direction of substrate P is the y direction, and the thickness direction of substrate P is the z direction. Each of the y direction and the z direction is the front-rear direction and the up-down direction of the mounter. These x direction, y direction, and z direction are orthogonal to one another.

Component supply device 6 supplies component s to be mounted on substrate P, and in the present example, includes multiple tape feeders 14.

Head moving device 8 holds and moves work head 16 in the x and y directions. Work head 16 includes suction nozzle 17 as an example of a component holder for holding component s, pin holder 19 for holding substrate support pin (hereinafter, may be referred to as "support pin") 18 illustrated in FIG. 9 and the like, and a lifting and lowering mechanism (not illustrated) for moving each of suction nozzle 17 and pin holder 19 in the z direction with respect to the head main body. Suction nozzle 17 is moved between component supply device 6 and substrate P by the movement of work head 16. Component s supplied by component supply device 6 is mounted on a predetermined position of substrate P. In addition, by the movement of work head 16, pin holder 19 is moved between an initial position and a reference position described later. As a result, support pin 18 installed at the initial position is moved to the reference position and installed. In the present example, automatic pin installation device 20 for automatically installing support pin 18 at the reference position is configured, including pin holder 19, head moving device 8, and the like.

substrate conveyance device 10 conveys substrate P in the x direction, and includes a pair of side plates 21 and 22 provided so as to be separated in the y direction, and a pair of conveyor mechanisms 23 and 24 attached to the pair of side plates 21 and 22, as illustrated in FIG. 2.

Each of the pair of side plates 21 and 22 extends in the x direction, and side plate 21 is fixed, so that side plate 22 can approach and separate from side plate 21. The pair of conveyor mechanisms 23 and 24 includes electric motor 26 (refer to FIG. 3) as a driving source, multiple pulleys (not illustrated), belt 28 hung on the multiple pulleys, and the like. Each of the multiple pulleys is rotatably held by side plates 21 and 22. By the driving of electric motor 26, the multiple pulleys are rotated, belt 28 is moved, and substrate P mounted on belt 28 is conveyed. Reference symbol 30 represents a support rail for supporting belt 28.

Substrate holding device 12 is a device for holding substrate P, and includes support base 40, multiple support pins 18, lifting and lowering device 44 for lifting and lowering support base 40, clamping device 46 for clamping substrate P, and the like.

Figure 10:
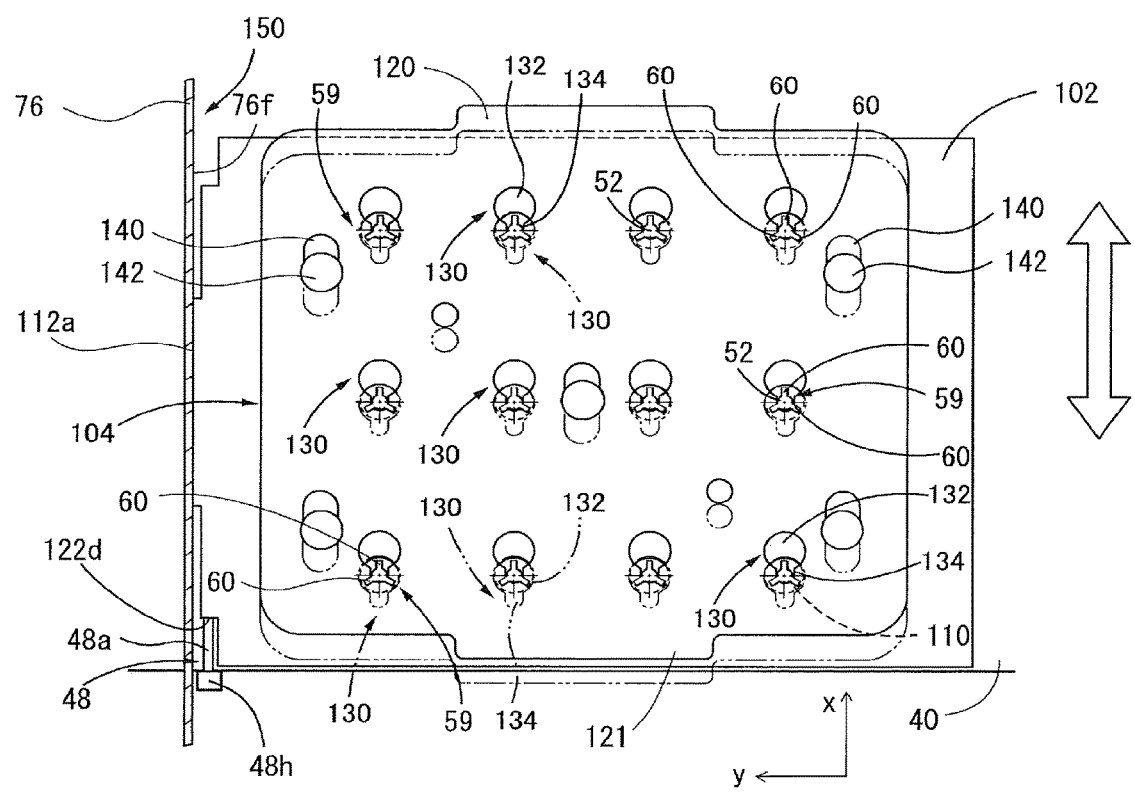
FIG. 10 is a plan view illustrating a state where the jig is placed on a support base.
Figure 11:
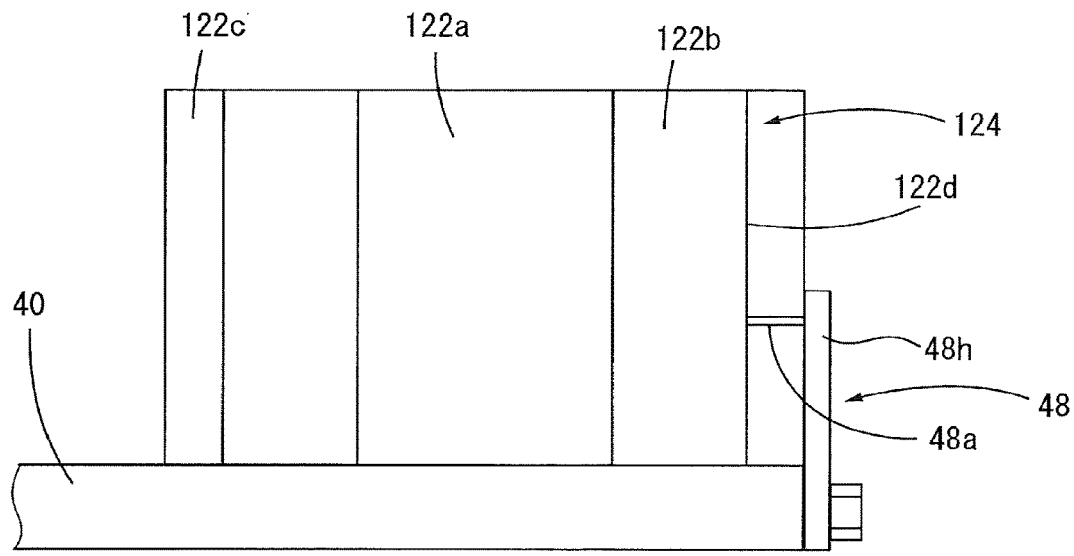
FIG. 11 is a front view illustrating a state where the jig is placed on the support base.

Support base 40 is manufactured with a magnetic material and is located below substrate conveyance device 10. Support base 40 is relatively lifted and lowered with respect to substrate P by lifting and lowering device 44. As illustrated in FIGS. 10 and 11, support base 40 is provided with x-direction positioning portion 48, which is a component of a positioning portion for determining a position of substrate support pin installation jig 100 described later. X-direction positioning portion 48 includes support post 48*h* fixed to support base 40, and engagement protrusion portion 48*a* attached to support post 48*h* and extending generally in the x direction. Engagement protrusion portion 48*a* may be expanded or contracted, for example, the amount of protrusion with respect to support post 48*h* can be changed by a screw mechanism or the like.

Figure 9:
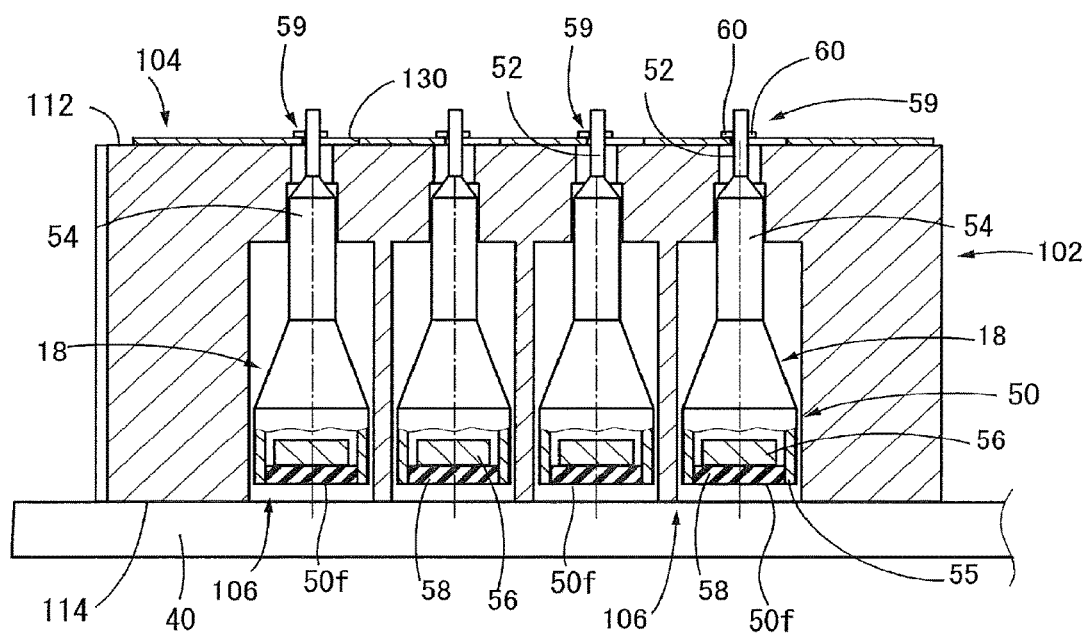
FIG. 9 is a cross-sectional view illustrating a state where the substrate support pin is accommodated in the jig and the holding member is at a holding position.

Support pin 18 supports substrate P from below, as illustrated in FIG. 9, has a stepped shape extending in the longitudinal direction, and includes bottom portion 50 having a large diameter, tip end portion 52 having a small diameter, and intermediate portion 54 between bottom portion 50 and tip end portion 52, having a medium diameter. Bottom portion 50 includes magnet 56 provided inside main body 55, and magnet holding portion 58 that holds magnet 56 from below. Support pin 18 is installed on support base 40 by magnet 56. In addition, since magnet holding portion 58 is interposed between magnet 56 and support base 40, the surface of support base 40 is hardly scratched. Engaged portion 59 is provided on tip end portion 52. Engaged portion 59 includes three protruding rods 60 (refer to FIG. 10) extending in the radial direction at intervals of central angles of 120°. Pin holder 19 holds support pin 18 by gripping engaged portion 59.

In the present example, lifting and lowering device 44 includes fluid cylinder 64 serving as a driving source and guide device 65. Support base 40 is attached to piston rod 66 of a piston (not illustrated) of fluid cylinder 64 via a lifting and lowering base. In fluid cylinder 64, the supply and discharge of the fluid are controlled by the control of fluid supply and discharge control device (refer to FIG. 3) 68, so that lifting and lowering of support base 40 is controlled.

Clamping device 46 includes a pair of side plates 21 and 22, a pair of receiving members 70 and 71, and a pair of push-up portions 73 and 74. Receiving members 70 and 71 press substrate P from above, and are provided so as to extend in the x direction. In addition, each of receiving members 70 and 71 protrudes in a direction facing each other from the pair of side plates 21 and 22, and the tip end portion is located inside belt 28. Push-up portions 73 and 74 include push-up plates 76 and 77, and holding bodies 78 and 79 for holding each of push-up plates 76 and 77 at the lower portions. Push-up plates 76 and 77 are held by holding bodies 78 and 79 in a state where the upper portions are protruded, and the upper end portions are located inside belt 28 and below the tip end portions of the pair of receiving members 70 and 71. Holding bodies 78 and 79 are held by side plates 21 and 22 in a state where they can be relatively lifted and lowered and are biased downward by a spring (not illustrated). Bolts 80 and 81 serving as engaging portions are attached to lower end portions of holding bodies 78 and 79, respectively.

As support base 40 is raised, the upper surface of support base 40 abuts on bolts 80 and 81, so that push-up portions 73 and 74 are lifted. Substrate P held by belt 28 is lifted by push-up plates 76 and 77, and is clamped by receiving members 70 and 71 and push-up plates 76 and 77. In addition, substrate P is supported from below by support pin 18.

Figure 3:
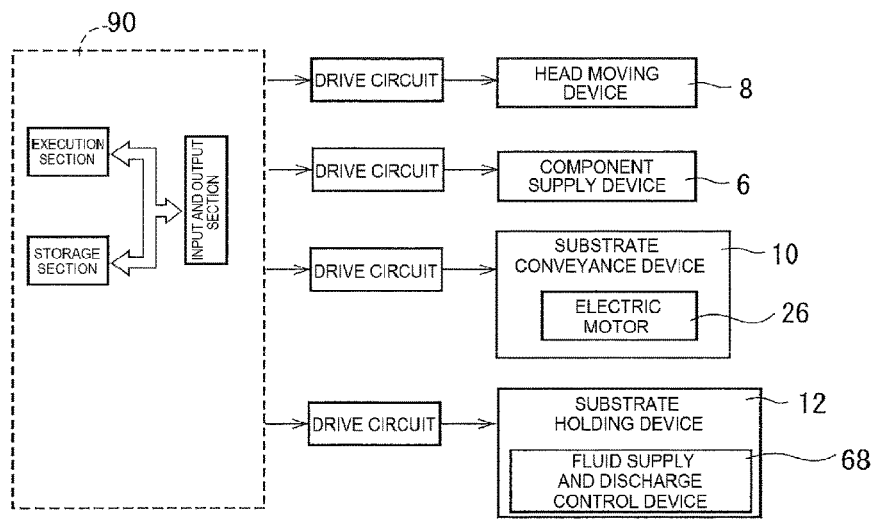
FIG. 3 is a block diagram conceptually illustrating a periphery of a control device of the mounter.

As illustrated in FIG. 3, the mounter includes control device 90 mainly including a computer. Control device 90 includes an execution section, a storage section, an input and output section, and the like (not illustrated), and head moving device 8, electric motor 26 of substrate conveyance device 10, fluid supply and discharge control device 68 of lifting and lowering device 44 of substrate holding device 12, and the like are connected to the input and output section via a drive circuit.

Each of one or more support pins 18 is automatically installed by automatic pin installation device 20 at the reference position (reference position means a position determined in advance based on the shape and characteristics of substrate P, and the mounting position of component s) on support base 40, and prior to the installation, the operator is required to install one or more support pins 18 at each of the predetermined initial positions. However, it is cumbersome to install one or more support pins 18 at each of the initial positions. In addition, the initial position of support pin 18 is often a position where it is difficult for the operator to work. Accordingly, in the present example, support pin 18 is installed at the initial position, that is, the initial setting is performed using substrate support pin installation jig (hereinafter, may be referred to as "jig") 100.

Figure 4:
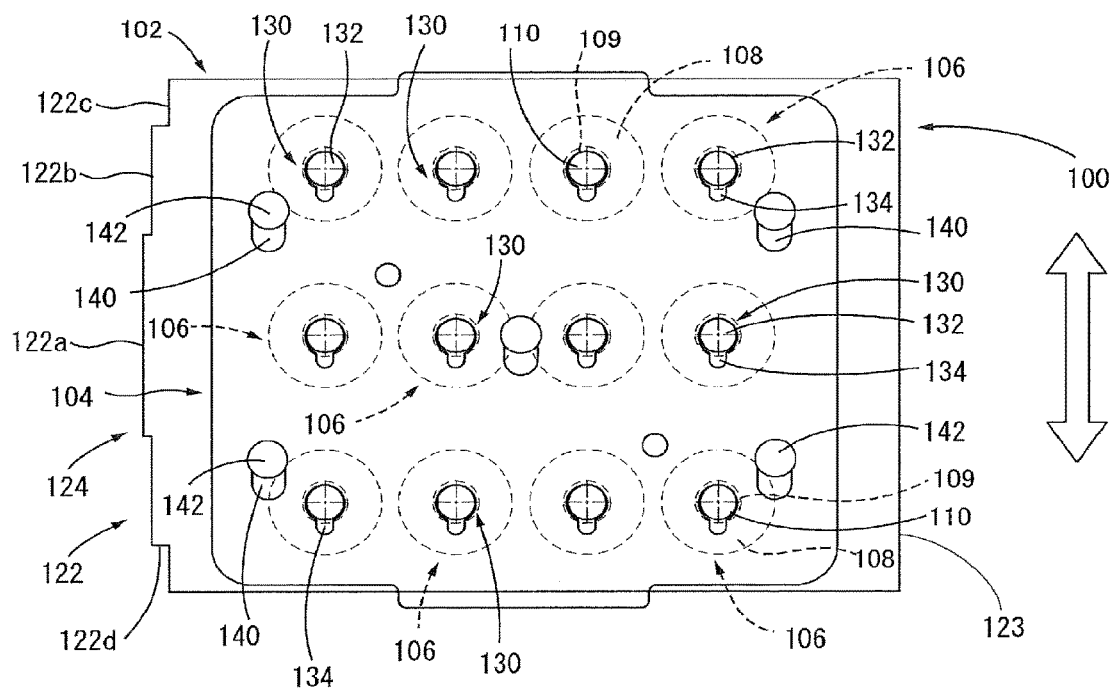
FIG. 4 is a plan view of a jig used for installing a substrate support pin of the substrate holding device.
Figure 5:
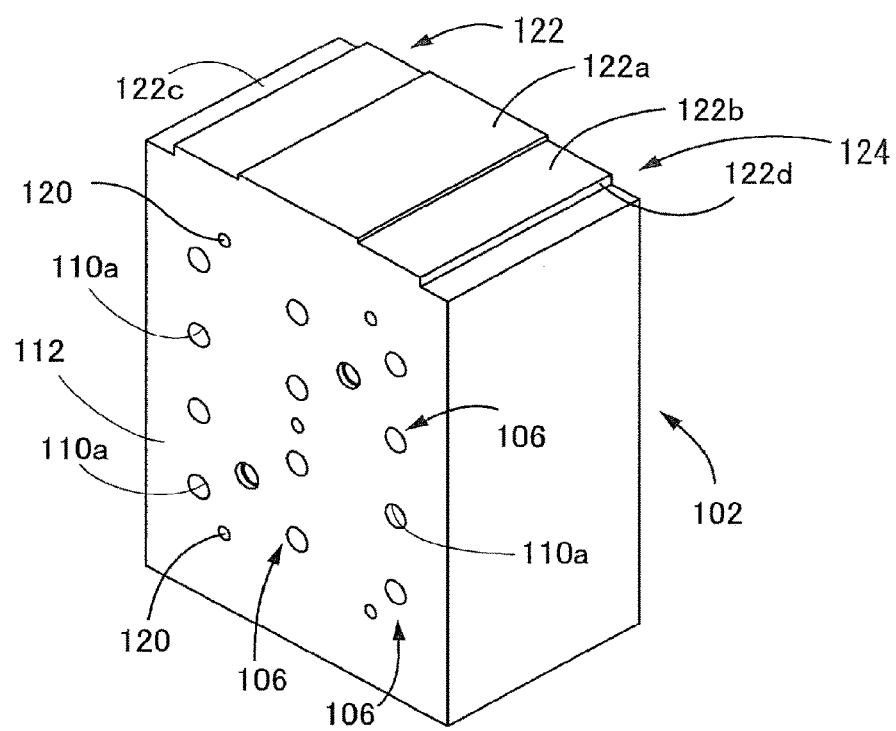
FIG. 5 is a perspective view illustrating a main body of the jig.
Figure 6:
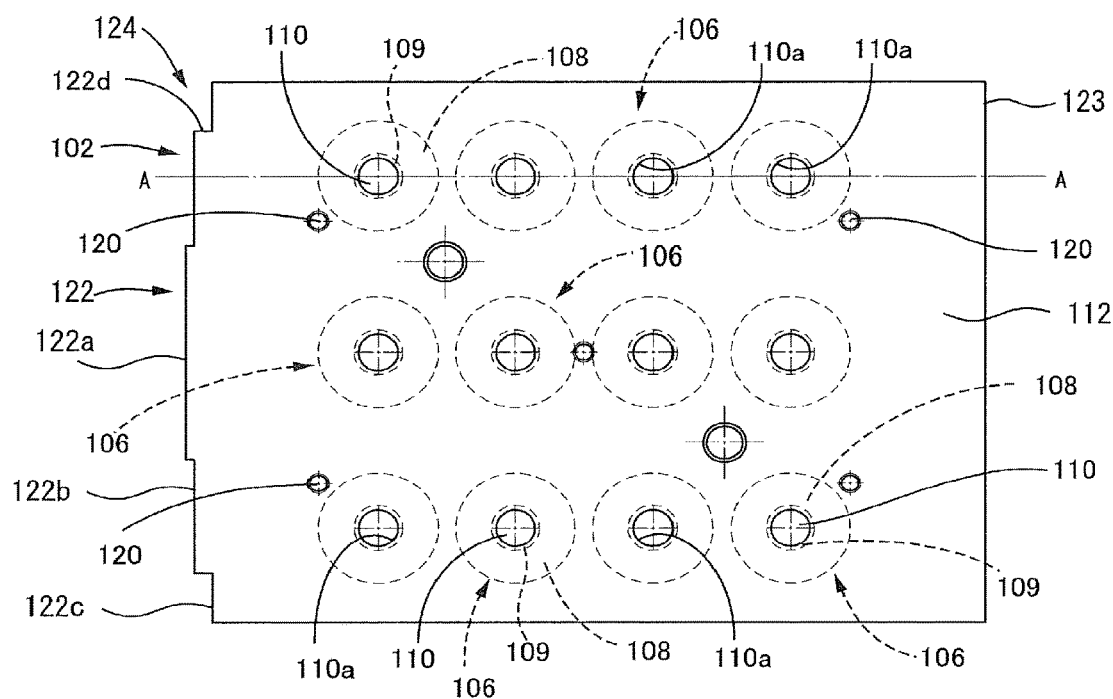
FIG. 6 is a plan view of the main body.
Figure 7:
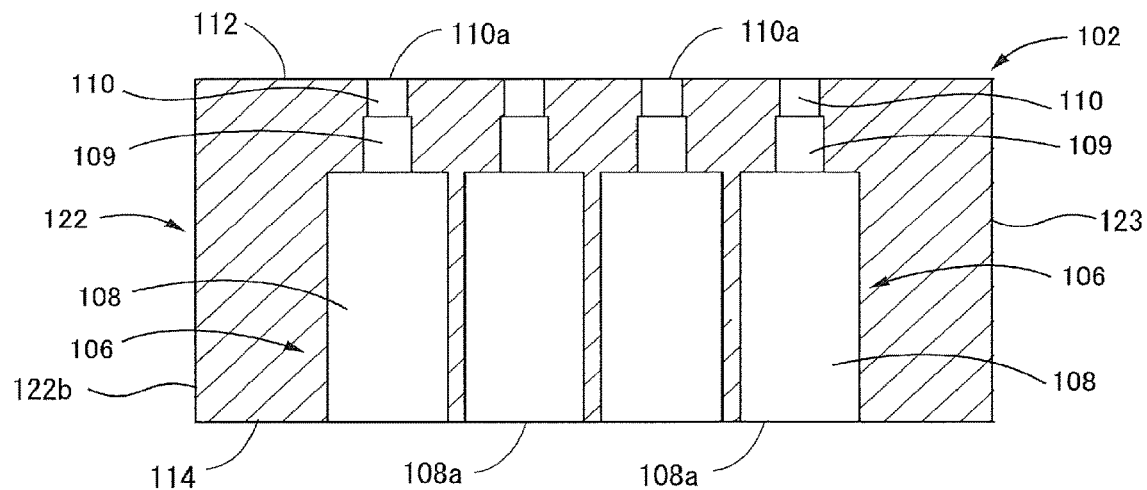
FIG. 7 is a cross-sectional view taken along the line A-A in FIG. 6.

Jig 100 is not fixedly provided on support base 40, is attachable and detachable and relatively movable, and includes main body 102 and holding member 104, as illustrated in FIG. 4. As illustrated in FIGS. 5 to 7, main body 102 has a generally rectangular parallelepiped shape, and multiple pin accommodating portions 106 capable of accommodating support pins 18 are provided inside main body 102. Support pin 18 is accommodated in pin accommodating portion 106 so as to be movable in the longitudinal direction thereof. Holding member 104 holds support pin 18 accommodated in pin accommodating portion 106, and is attached to main body 102 so as to be relatively movable, that is, to be slidable.

As illustrated in FIG. 7, pin accommodating portion 106 is a through-hole extending through a pair of surfaces 112 and 114 of main body 102 facing each other, and is formed in parallel with each other and arranged side by side at intervals. Each of pin accommodating portions 106 has a stepped shape having different hole diameters, and includes large-diameter hole portion 108, medium-diameter hole portion 109, and small-diameter hole portion 110. The diameter of large-diameter hole portion 108 is larger than the diameter of bottom portion 50 of support pin 18, the diameter of medium-diameter hole portion 109 is larger than the diameter of intermediate portion 54 of support pin 18, and the diameter of small-diameter hole portion 110 is larger than the outer diameter of engaged portion 59 of support pin 18. The outer diameter of engaged portion 59 is determined by the tip end portions of three protruding rods 60. Opening 110a of small-diameter hole portion 110 of pin accommodating portion 106 is located on surface 112 of main body 102, and opening 108a of large-diameter hole portion 108 is located on surface 114. In addition, multiple pin holes 120 are provided on surface 112.

Front surface 122 of main body 102 has a stepped shape. Front surface 122 includes first surface 122a, second surface 122b, and third surface 122c that are located at different distances from rear surface 123 facing front surface 122, and cross-section 122d between second surface 122b and third surface 122c. Cross-section 122d and first surface 122a extend in a direction intersecting each other, for example, in a direction orthogonal to each other. In the present example, positioned portion 124 is configured to include first surface 122a, cross-section 122d, and the like.

Figure 8:
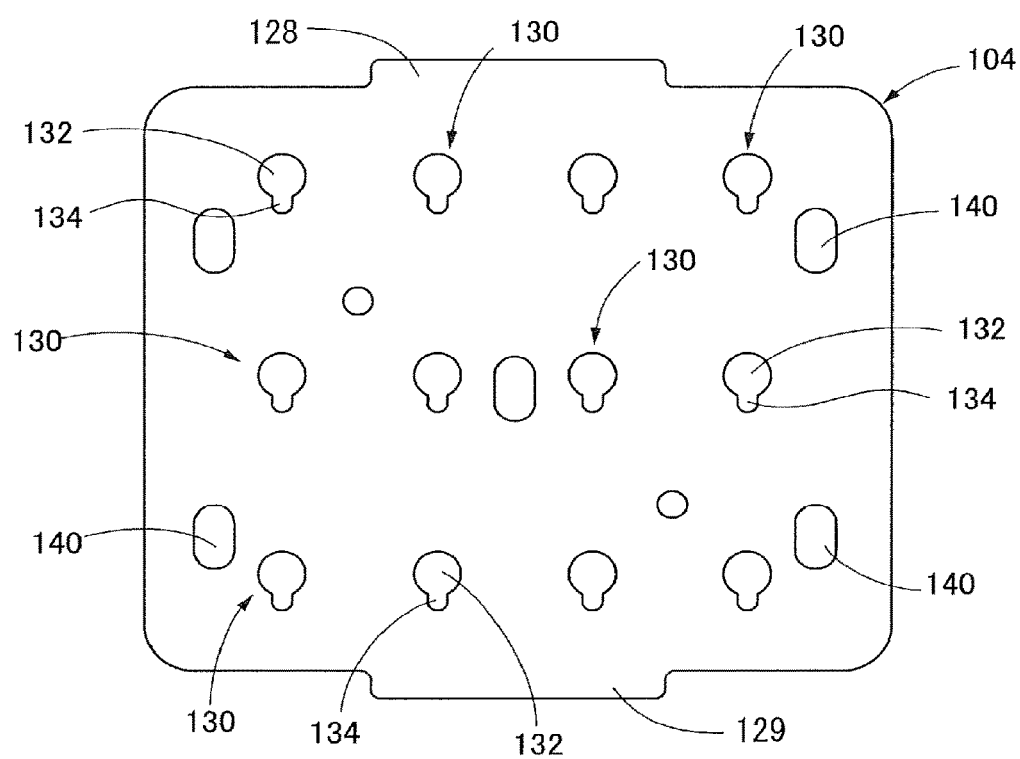
FIG. 8 is a plan view of a holding member of the jig.

As illustrated in FIG. 8, holding member 104 has a plate shape having a generally rectangular shape, and through-hole 130 having large-diameter hole portion 132 and small-diameter hole portion 134 communicating with each other are provided at each of positions of holding member 104 corresponding to pin accommodating portion 106 of main body 102. The diameter of large-diameter hole portion 132 is larger than the outer diameter of engaged portion 59 of support pin 18, and the diameter of small-diameter hole portion 134 is smaller than the outer diameter of engaged portion 59 and larger than the diameter of tip end portion 52.

In addition, long hole 140 of holding member 104 is formed at each of positions corresponding to multiple pin holes 120 of main body 102. Long hole 140 extends in a direction parallel to the direction where large-diameter hole portion 132 and small-diameter hole portion 134 of through-hole 130 are arranged side by side, and holding member 104 is slidably held in long hole 140 by pin 142 attached to pin hole 120 on surface 112 of main body 102, as illustrated in FIGS. 4 and 10. Holding member 104 is slidable along surface 112 between a non-holding position where large-diameter hole portion 132 corresponds to opening 110a and a holding position where small-diameter hole portion 134 corresponds to opening 110a. The limit of the slide movement of holding member 104 is specified by pin 142 and both end edges of long hole 140.

In the holding position, holding member 104 engages with engaged portion 59 of support pin 18 to hold support pin 18. In the non-holding position, the holding of support pin 18 is released without engaging with engaged portion 59 of support pin 18. In addition, protrusion portions 128 and 129 protruding outward are provided on both end portions of holding member 104 in the extending direction of long hole 140, respectively, and function as handles when holding member 104 is moved.

The operation in a case where the initial setting is performed using jig 100 configured as described above will be described.

At least one support pin 18 is held by jig 100 (holding step).

In the non-holding position of holding member 104, each of at least one support pin 18 is accommodated in at least one of multiple pin accommodating portions 106 of main body 102. Support pin 18 is inserted through opening 108a of large-diameter hole portion 108, and tip end portion 52, that is, engaged portion 59, is in a posture of protruding from opening 110a of main body 102 and large-diameter hole portion 132 of holding member 104. Thereafter, holding member 104 is moved to the holding position between engaged portion 59 and surface 112 of main body 102. Since the outer diameter of engaged portion 59 is larger than the diameter of small-diameter hole portion 134 of holding member 104, holding member 104 engages with engaged portion 59 at the holding position to hold support pin 18, as illustrated in FIG. 9. In addition, since three protruding rods 60 are provided at 120° intervals, holding member 104 can engage with at least one of three protruding rods 60 in the holding position regardless of the phase of support pin 18. In a state where holding member 104 engages with engaged portion 59, bottom surface 50f of bottom portion 50 of support pin 18 is located inside surface 114. The holding step can be referred to as an engagement step in which holding member 104 engages with engaged portion 59.

Jig 100 for holding support pin 18 is placed on support base 40 (jig placement step).

As illustrated in FIGS. 10 and 11, main body 102 is placed on support base 40 in a posture in which surface 114 is a lower surface and surface 112 is an upper surface in a state where first surface 122a abuts on inner surface 76f of push-up plate 76 on the fixed side and cross-section 122d abuts on engagement protrusion portion 48a. When inner surface 76f and first surface 122a abut on each other, the position of jig 100 in the y direction is determined, and when engagement protrusion portion 48a and cross-section 122d abut on each other, the position of jig 100 in the x direction is determined. Inner surface 76f of push-up plate 76 has a function as a y-direction positioning portion for determining the position of jig 100 in the y direction, and positioning portion 150 is configured to include y-direction positioning portion 76f, x-direction positioning portion 48, and the like. A relative position of jig 100 on support base 40 is determined by positioning portion 150 of substrate holding device 12 and positioned portion 124 of jig 100, and jig 100 is positioned (positioning step).

In addition, in a state where jig 100 is placed on support base 40, support pin 18 is held by holding member 104 in a state where bottom surface 50f of bottom portion 50 is separated from support base 40, as illustrated in FIG. 9. Accordingly, the influence of magnet 57 is reduced, and jig 100 can be moved easily on support base 40.

Support pin 18 is installed on support base 40 (pin installing step and pin initial position installing step).

Figure 12:
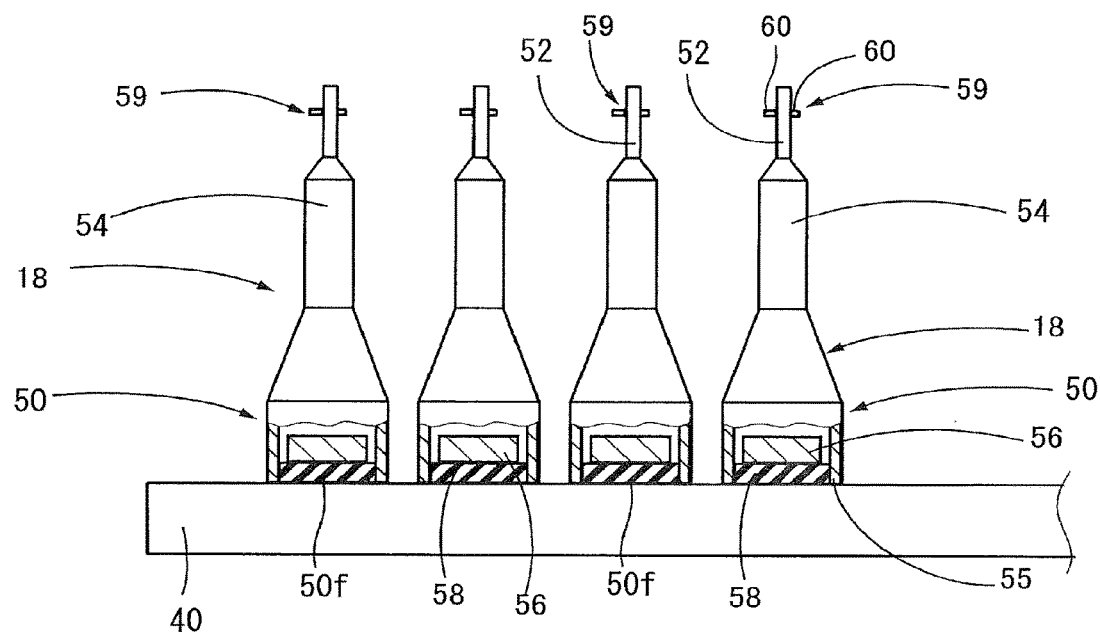
FIG. 12 is a front view illustrating a state where the substrate support pin is placed on the support base.

Holding member 104 is moved to the non-holding position as indicated by the two-dot chain lines in FIG. 10. Since the outer diameter of engaged portion 59 is smaller than the diameter of large-diameter hole portion 132 of holding member 104 and smaller than the diameter of small-diameter hole portion 110 of main body 102, the holding of support pin 18 is released, and support pin 18 drops. Bottom portion 50 of support pin 18 is installed with abutting on support base 40. As illustrated in FIG. 12, at least one support pin 18 is installed at each of the initial positions. Thereafter, jig 100 is removed.

Thereafter, at least one support pin 18 installed at the initial position of support base 40 is gripped one by one by automatic pin installation device 20, moved to the reference position, and installed. As a result, at least one support pin 18 can be installed in each of the reference positions (pin reference position installing step). In the present example, component s is mounted in a state where substrate P is supported from below by support pin 18.

As described above, in the present example, at least one support pin 18 can be collectively set to the initial position using jig 100. The operator is not required to install support pins 18 one by one, and moreover, can accurately install support pins 18 by positioned portion 124 of jig 100 and positioning portion 150 of substrate holding device 12. As a result, support pin 18 can be satisfactorily installed at the reference position by automatic pin installation device 20.

Although the case where jig 100 is used when support pin 18 is installed in the mounter has been described in the present example, jig 100 can also be used when support pin 18 is installed in a screen printing machine. In addition, jig 100 can be used not only when support pin 18 is set to the initial position but also when support pin 18 is set to the reference position.

Furthermore, the shape of the support pin is not limited. For example, engaged portion 59 may include four or more protruding rods 60 provided at equal intervals.

Figure 13:
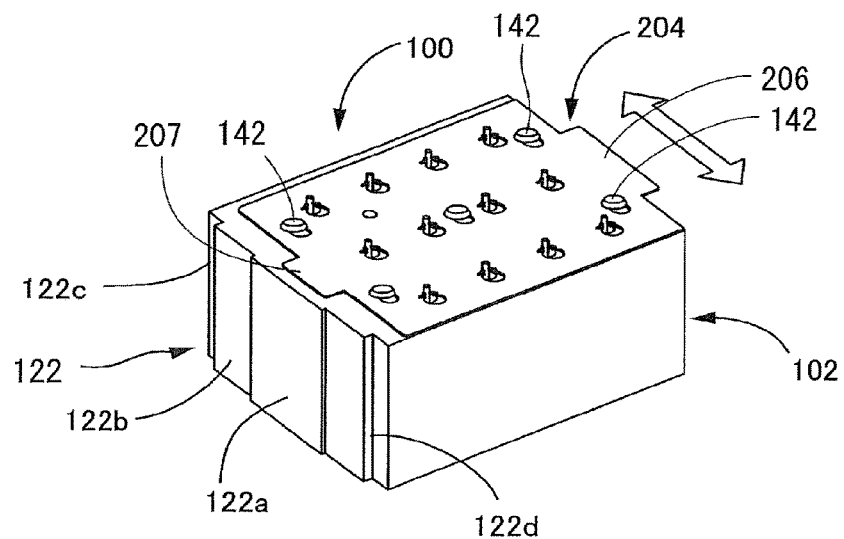
FIG. 13 is a perspective view illustrating another aspect of the jig.

In addition, the shape of the holding member is not limited. For example, as illustrated in FIG. 13, protrusion portions 206 and 207 of holding member 204 can be provided at both end portions in a direction orthogonal to the extending direction of long hole 140 of holding member 204.

Figure 14:
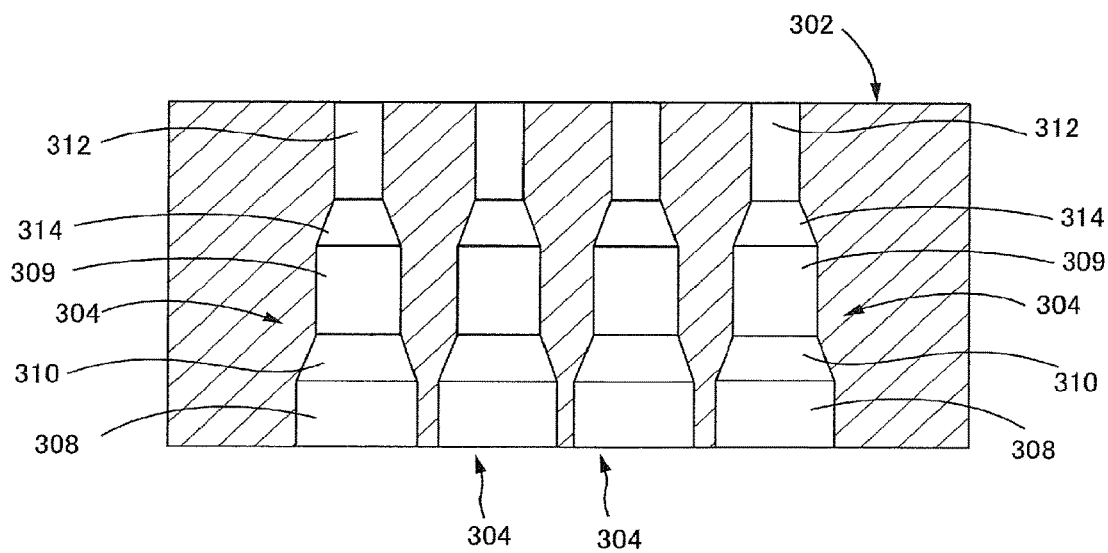
FIG. 14 is a cross-sectional view illustrating another aspect of the main body of the jig.

In addition, the shape of the pin accommodating portion is not limited. For example, as illustrated in FIG. 14, pin accommodating portion 304 provided in main body 302 may have a shape having large-diameter hole portion 308, medium-diameter hole portion 309, small-diameter hole portion 312, inclined portion 310 located between large-diameter hole portion 308 and medium-diameter hole portion 309 and in which the hole diameter continuously changes, inclined portion 314 located between medium-diameter hole portion 309 and small-diameter hole portion 312 and in which the hole diameter continuously changes, and the like. By providing inclined portions 310 and 314, support pin 18 can be easily inserted into pin accommodating portion 304.

Figure 15:
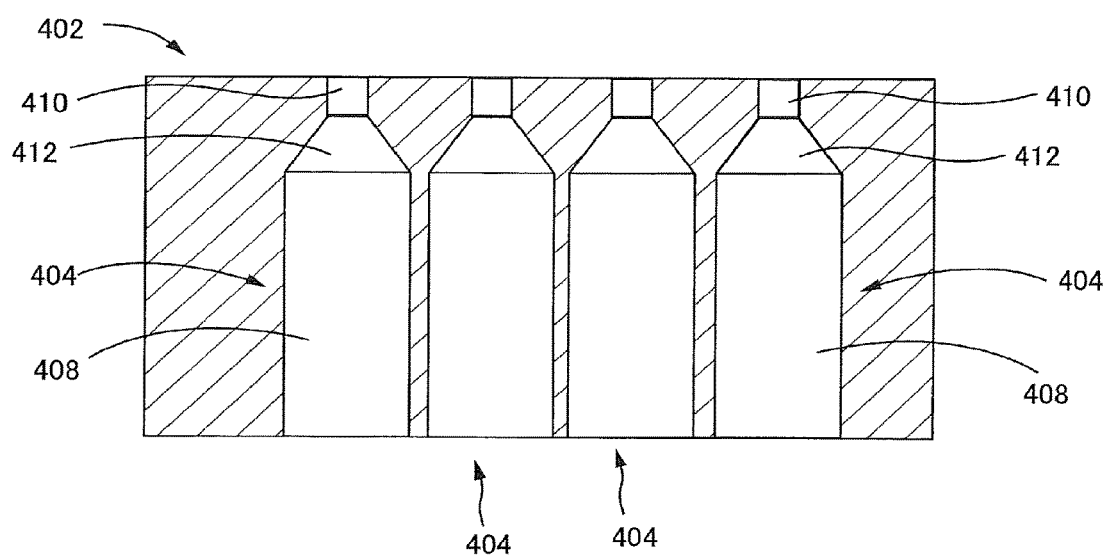
FIG. 15 is a cross-sectional view illustrating still another aspect of the main body of the jig.

In addition, as illustrated in FIG. 15, the shape of pin accommodating portion 404 provided in main body 402 may be a shape having large-diameter hole portion 408, small-diameter hole portion 410, inclined portion 412 located between large-diameter hole portion 408 and small-diameter hole portion 410 and in which the hole diameter continuously changes, and the like. Pin accommodating portion 404 has a shape such that medium-diameter hole portion 109 is formed as inclined portion 412 in pin accommodating portion 106 illustrated in FIG. 7 or the like. Also in the present example, inclined portion 412 facilitates the insertion of support pin 18 into pin accommodating portion 404.

In addition, the shape of main body 102 is not limited. For example, pedestals can be provided at four corners of surface 122. Support pin 18 can be accommodated in pin accommodating portion 106 in a state where the pedestal abuts on the working surface.

Furthermore, in the above example, inner surface 76f of push-up plate 76 of substrate holding device 12 is used as the y-direction positioning portion, and the present disclosure can be performed in an aspect in which various modifications and improvements are made based on the knowledge of those skilled in the art, such as a case where the y-direction positioning portion can be provided on the support base.

REFERENCE SIGNS LIST

12: substrate holding device, 40: support base, 42: substrate support pin, 48: x-direction positioning portion, 76f: y-direction positioning portion, 100: substrate support pin installation jig, 102, 302, 402: main body, 104, 204: holding member, 106, 304, 404: pin accommodating portion, 122a: first surface, 122d: cross-section, 124: positioned portion, 130: through-hole, 132: large-diameter hole portion, 134: small-diameter portion, 140: long hole, 142: pin, 150: positioning portion

The invention claimed is:

1. A substrate support pin installation jig used for installing at least one substrate support pin supporting a circuit substrate on a support base, the jig comprising:
   a main body configured to move relative to the support base, the main body including a front surface with a stepped shape, the front surface including a first surface slidable on a push-up plate supported by the support base;
   multiple pin accommodating portions provided in the main body and configured to accommodate multiple substrate support pins including the at least one substrate support pin; and
   a holding member including a hole of a first diameter and a hole of a second diameter provided in the main body and configured to be switched between a holding position where each of the multiple substrate support pins accommodated in each of the multiple pin accommodating portions is held by the hole of the first diameter and a non-holding position where each of the multiple substrate support pins is not held by the hole of the second diameter,
   wherein the front surface includes a cross-section that is orthogonal to the first surface, the cross-section configured to be contacted by an engagement protrusion attached to an engagement post fixed to the support base, the engagement protrusion moves the main body relative to the support base by sliding along the first surface.

2. The substrate support pin installation jig according to claim 1, wherein
   each of the multiple substrate support pins includes a bottom portion and a tip end portion provided with an engaged portion,
   each of multiple pin accommodating portions is a through-hole extending in a longitudinal direction,
   the holding member holds each of the multiple substrate support pins by engaging with the engaged portion in a state where the engaged portion protrudes from the through-hole and a bottom surface of the bottom portion is separated from the support base at the holding position, and does not hold the multiple substrate support pins without engaging with the engaged portion at the non-holding position, and the bottom surface of the substrate support pin is in a state of abutting on the support base at the non-holding position of the holding member.

3. A substrate support pin installation jig comprising:

a main body, the main body including a front surface with a stepped shape, the front surface including a first surface slidable on a push-up plate supported by a support base;

multiple pin accommodating portions that are provided in the main body and that are through-holes configured to accommodate each of multiple substrate support pins; and a holding member configured to be switched between a holding position where each of the multiple substrate support pins accommodated in each of the multiple pin accommodating portions is held and a non-holding position where the multiple substrate support pins are not held, wherein the front surface includes a cross-section that is orthogonal to the first surface, the cross-section configured to be contacted by an engagement protrusion attached to an engagement post fixed to the support base, the engagement protrusion moves the main body relative to the support base by sliding along the first surface, the substrate support pin installation jig configured to install at least one substrate support pin accommodated in at least one of the multiple pin accommodating holes on the support base, the substrate support pin includes a bottom portion and a tip end portion provided with an engaged portion, the holding member engages with the engaged portion in a state where the engaged portion of the substrate support pin protrudes from the through-hole and a bottom surface of the bottom portion is separated from the support base at the holding position, and does not engage with the engaged portion of the substrate support pin at the non-holding position, and the holding member includes a hole of a first diameter and a hole of a second diameter provided in the main body and configured to be switched between the holding position where each of the multiple substrate support pins accommodated in each of the multiple pin accommodating portions is held by the hole of the first diameter and the non-holding position where each of the multiple substrate support pins is not held by the hole of the second diameter.

* * * * *